United States Patent Office 3,167,463
Patented Jan. 26, 1965

3,167,463

METHOD OF BURNING IN PHOTORESISTS AND THEN ETCHING

Robert J. Patsko, Merion, Pa., assignor to Master Etching Machine Company, Wyncote, Pa., a corporation of Pennsylvania No Drawing. Filed Nov. 22, 1961, Ser. No. 154,323
2 Claims. (Cl. 156—13)

The present invention relates to burning in of photoresists of the class consisting of bichromated shellac and bichromated polyvinyl alcohol on metallic work and to etching of said metallic work while protected by said resist after burning in.

A purpose of the invention is to improve the quality of the photoresists obtained on metallic plates such as zinc, copper, aluminum, steel or stainless steel, by burning in bichromated shellac or bichromated polyvinyl alcohol.

A further purpose is to reduce the difficulty which has occurred due to overburning.

A further purpose is to avoid underburning of image areas.

A further purpose is to avoid difficulty through localized overburning or underburning or both, resulting in non-uniformity of protection of image areas by the photoresist.

A further purpose is to obtain better temperature control.

A further purpose is to reduce the power consumption in burning in a photoresist.

Further purposes appear in the specification and in the claims.

The present invention relates to the etching of metallic work such as printing plates produced by photoengraving, printed electrical and electronic circuits produced by etching, and ornamental work including plates, medallions and the like which are produced by etching.

In such techniques, one employs a photoresist which is capable of photographic exposure to convert it in the image area to a resist.

After photographic exposure and development, the resist in the non-image areas is removed by dissolving suitably in water, as in the case of polyvinyl alcohol base resists; or in ethyl alcohol in the case of shellac based resists; while the resist in the image areas remains insoluble.

The metallic work, for example the plate, having the resist present in the image areas is then burned in to convert the photoresist in the image areas to a coating which will resist the attack of the etching acid. The metallic work after burning in is then exposed to etching in an etching machine using any of the well known techniques such as nitric acid, ferric chloride, etc., depending on the metal of which the plate is made.

While the invention finds its widest application applied to zinc, it is applicable also to copper, aluminum, steel and stainless steel plates and other work.

The practice in the prior art in burning in has been either to use a gas oven or an electrically heated resistor oven.

The metallic work bearing the photoresist in the image areas is placed in a heated oven or over an open flame, and burning in is continued under the control of the operator until the resist is converted to an acid protecting form. The guide to the skilled operator has either been the change in color of the image on the plate or the change in appearance of a temperature sensitive crayon applied to the plate.

Serious difficulties have developed in burning in. The following are a few examples:

Overburning causes cracking of the photoresist in the image areas and this results in unintended etching at the places where the cracks occur and in some cases even destruction of part of the image areas.

If overburning is sufficiently severe, the metal of the plate itself changes its structure in the non-image areas and the non-image areas do not etch in the normal manner so that it may be impossible to etch the plate effectively. This difficulty is most likely to occur in zinc, which has a low recrystallization temperature.

A difficulty which has occurred more frequently than general overburning or underburning is non-uniform burning, in which for example some areas of the plate are overburned or some areas of the plate are underburned, or both conditions occur in different areas of the plate.

In some instances, difficulty has not only occurred in respect to the preservation of the image areas or the proper etching of the plate, but uneven or improper burning in has resulted in buckling or distortion of the plate so that it no longer lies flat or curved as the case may be.

The present invention is concerned with the improvement of burning in techniques applied to certain types of photoresists. My experiments indicate, however, that the invention does not operate on bichromated glue photoresists, and the user is therefore warned not to apply the technique of the invention to bichromated glue, because it results in destroying the resist in the image area. This may be due to the fact that at the high temperatures of 550 to 600° F. used in burning in bichromated glue the salt bath is more reactive and therefore destroys the bichromated glue.

I have discovered that greatly improved burning in can be accomplished on photoresists consisting either of bichromated shellac or bichromated polyvinyl alcohol by immersing the metal work, that is, the printing plate, printed circuit plate or the like, in a molten salt bath according to the present invention.

The salt bath which I find operates effectively consists of a mixture of nitrate and nitrite. The nitrate should be sodium nitrate or potassium nitrate, or a mixture thereof, in the range of 30 to 60% by weight. The nitrite is sodium nitrite in the proportion of 40 to 70% by weight of the salt bath.

These mixtures provide salt baths with freezing points ranging from approximately 280° F. to 325° F. and of course it will be evident that no salt bath will be used below its freezing point.

The salt bath will operate effectively for burning in bichromated shellac or bichromated polyvinyl alcohol photoresists on plates of any of the metals zinc, copper, aluminum, steel or stainless steel, at temperatures of 300–450° F., although the preferable range of temperature is 350–400° F. and the most desirable range is 375–400° F. The bath is suitably heated, and temperature controlled by a thermostat.

The plate is coated with the photoresist, photographed and washed in the usual manner for bichromated shellac or bichromated polyvinyl alcohol as well known in the art.

The metallic work is then dipped in the salt bath and held until burning in is complete, usually in a time of 30 seconds to two and one-half minutes for 16 gauge metal, usually about 1 minute, as determined by periodic inspection by the operator. The time will change with the gauge of metal as is well known.

One of the greatest advantages of the process of the invention is that overburning does not occur, since unlike the gas or electric ovens, the prevailing temperature is not greatly higher than the desired burning temperature.

The control according to the invention is so effective that underburning is very unlikely to occur also and, therefore, washing off of image areas in the etching bath is not likely to take place.

One of the greatest advantages of the invention is that greater uniformity is possible in the conversion of the image areas over the surface of the printing or other plate.

Careful testing indicates that the nitrate and nitrite bath above referred to does not damage bichromated shellac or bichromated polyvinyl alcohol photoresists, although as explained above, it is destructive to bichromated glue photo-resists and these cannot be used in the process of the invention.

It is, therefore, evident that the invention should be used in what is commonly referred to as powderless etching.

The invention offers additional advantages because difficulty through buckling of the plates is avoided. In fact, the plates can simply be immersed in the salt bath and rapid heat transfer occurs.

One of the great virtues of the invention is that the salt bath protects the metal plate from the air and, therefore, in non-image areas, protects against oxidation of the plate during burning in. This assures that the non-image areas are more likely to etch uniformly.

It will be evident that automatic thermostatic control will be applied to an electric heater for the salt bath, which heater in itself forms no part of the present invention. This assures accurate temperature control and low power consumption. Insulation of the salt bath likewise diminishes heat loss.

No harmful vapors or fumes occur in the process at the temperatures under discussion. It will, however, be recognized that the usual precautions applied to nitrate baths including avoidance of powdered carbonaceous material, should be taken.

Once the burning in is complete, the plate can simply be quenched in water at room temperature, removing any film of salt. This quench from the burning in temperature does not cause buckling or distortion of the plate.

In view of my invention and disclosure, variations and modifications to meet individual whim or particular need will doubtless become evident to others skilled in the art to obtain all or part of the benefits of my invention without copying the process shown, and I, therefore, claim all such insofar as they fall within the reasonable spirit and scope of my claims.

Having thus described my invention what I claim as new and desire to secure by Letters Patent is:

1. The method of burning in photoresists of the class consisting of bichromated shellac and bichromated polyvinyl alcohol, which comprises maintaining a molten salt bath composed of 30 to 60% of a nitrate of the class consisting of sodium nitrate and potassium nitrate and 40 to 70% of sodium nitrite at a temperature between 300 and 450° F., and immersing metallic work to be etched covered with a photoresist of the class consisting of bichromated shellac and bichromated polyvinyl alcohol in said molten salt bath until the photoresist has been burned in.

2. The method of etching metallic work coated with a photoresist of the class consisting of bichromated shellac and bichromated polyvinyl alcohol, which comprises immersing the metallic work coated with a photoresist of the class consisting of bichromated shellac and bichromated polyvinyl alcohol in a molten salt bath consisting of from 30 to 60% of a nitrate of a class consisting of sodium nitrate and potassium nitrate and from 40% to 70% of sodium nitrite, maintained at a temperature between 300 and 450° F. to burn in the photoresist, and subsequently etching the metallic work while it is protected by said photoresist.

References Cited by the Examiner

UNITED STATES PATENTS

| | | | |
|---|---|---|---|
| 1,751,909 | 3/30 | Davis. | |
| 2,830,899 | 4/58 | Brown | 96—36 |
| 2,888,391 | 5/59 | Loughman | 96—36 |
| 3,138,504 | 6/64 | Quinn | 156—18 |

EARL M. BERGERT, *Primary Examiner.*

HAROLD ANSHER, *Examiner.*